United States Patent [19]

Eng et al.

[11] Patent Number: 5,798,564
[45] Date of Patent: Aug. 25, 1998

[54] MULTIPLE CHIP MODULE APPARATUS HAVING DUAL SIDED SUBSTRATE

[75] Inventors: Kian Teng Eng; Jing Sua Goh, both of Singapore, Singapore

[73] Assignee: Texas Instruments Incorporated, Dallas, Tex.

[21] Appl. No.: 770,884

[22] Filed: Dec. 20, 1996

Related U.S. Application Data

[60] Provisional application No. 60/009,035 Dec. 21, 1995.
[51] Int. Cl.[6] .................................................. H01L 23/02
[52] U.S. Cl. .................................................. 257/686; 257/723
[58] Field of Search ............................... 257/684, 685, 257/686, 723, 778

[56] References Cited

U.S. PATENT DOCUMENTS

| | | | |
|---|---|---|---|
| 5,231,304 | 7/1993 | Solomon | 257/723 |
| 5,376,825 | 12/1994 | Tukamoto et al. | 257/685 |
| 5,440,171 | 8/1995 | Miyano et al. | 257/723 |
| 5,481,133 | 1/1996 | Hsu | 257/777 |

*Primary Examiner*—Tom Thomas
*Assistant Examiner*—Roy Potter
*Attorney, Agent, or Firm*—Mark E. Courtney; W. James Brady, III; Richard L. Donaldson

[57] ABSTRACT

The invention is to a double side semiconductor module (10) and an array (40) made up of a plurality of stacked modules (10). Each module (10) includes a plurality of substrates (11–15). A first substrate (13) has first and second sides, with one semiconductor device (16,25) having bond pads thereon (17,26), mounted on each of said first and second sides. At least one additional substrate (12,14) having a central opening (12b,14b), is placed on each of said first and second sides with the semiconductor device (16,25) mounted in the central opening (12b,14b). A plurality of solder pins (11a–15a), associated with each of said substrates (11–15) are connected to contact pads (17,26) on the semiconductor devices (16,25), and extend from and to openings in said substrates (11–15).

6 Claims, 7 Drawing Sheets

MULTIPLE CHIP MODULE APPARATUS HAVING DUAL SIDED SUBSTRATE

This application claims prioroty 35 USC § 119(e)(1) of provisional application Ser. No. 60/009,035, filed Jan. 21, 1995.

FIELD OF THE INVENTION

This invention relates to semiconductor devices, and more particularly to a high density module of stacked integrated circuits.

BACKGROUND OF THE INVENTION

Memory devices, particularly in computers, are arrayed on the computer circuit board, or mounted on small circuit boards to group memory devices into distinct amount of memory. For example, SIMM devices, Semiconductor Inline Memory Module, utilize several devices interconnected on a small circuit board to form memory modules. The sockets into which the memory circuit boards are mounted on the computer circuit board occupies considerable space, especially if the computer is to be designed to utilize from 4 megabytes or more of memory. As computer boards become more complex, and additional functions are integrated into the computer circuit board, the space required for individual memory device and SIMM modules needs to be reduced to accommodate other circuitry.

SUMMARY OF THE INVENTION

The invention is to a double side semiconductor module and an array made up of a plurality of stacked modules. Each module includes a plurality of substrates. A first substrate has first and second sides, with one semiconductor device, having bond pads thereon, mounted on each of said first and second sides. At least one additional substrate, having a central opening, is placed on each of said first and second sides with the semiconductor device mounted in the central opening. A plurality of solder pins, associated with each of said substrates are connected to contact pads on the semiconductor devices, and extend from and to openings in said substrates.

The technical advance represented by the invention, as well as the objects thereof, will become apparent from the following description of a preferred embodiment of the invention when considered in conjunction with the accompanying drawings, and the novel features set forth in the appended claims.

DESCRIPTION OF A PREFERRED EMBODIMENT

Figure 1:
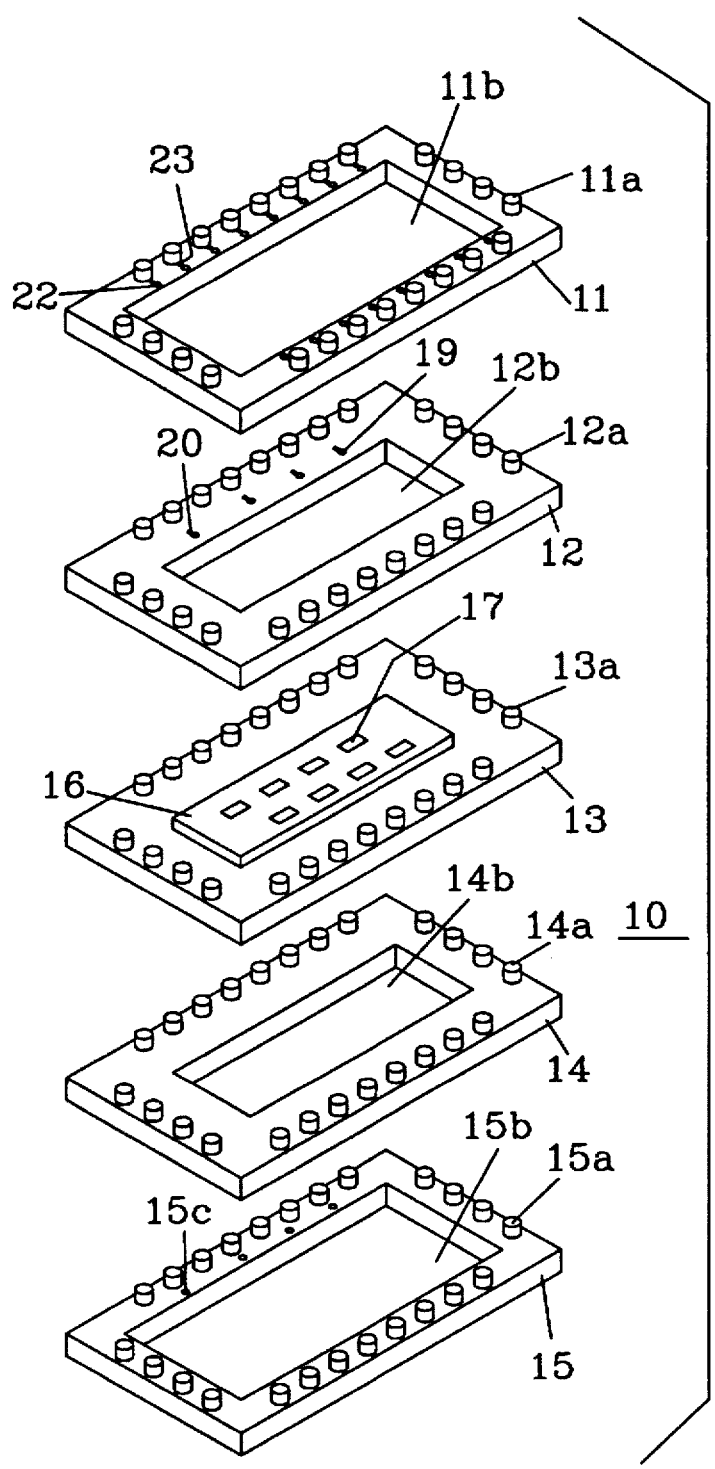
FIG. 1 is an exploded view of a module.

FIG. 1 is an exploded view of module 10 showing the five layers or substrates 12, 13, 14 and 15, of an insulating material. Substrates 11–15 may be, for example, printed circuit board, plastic, ceramic, or any other insulating material that is suitable for making layers 11–15.

The center substrate, substrate 13, of the module is a solid rectangular substrate that has a semiconductor device mounted on each side. Only semiconductor device 16 is shown in FIG. 1. Semiconductor device 16 is bonded to substrate 13 with any suitable adhesive material or tape. Examples of suitable adhesives are JM2500 and Hitachi EN4072. Semiconductor device 16 has a plurality of bond pads 17 used to connected semiconductor 16 to external circuitry. Around the edges of substrate 13 are a plurality of solder pins or columns 13a that are used to interconnect substrates, to connect semiconductor device 16 to other devices on other layers of the module 10, and to external circuitry to which the module is connected.

Substrate 12 is placed on top of substrate 13 and has an opening 12 through which semiconductor device 16 is mounted on substrate 13. A plurality of solder pins 12a are positioned around the edges of substrate 12. Substrate 12 has a plurality of interconnections 20 on top of substrate 12 which are connected to bond or stitch pads 19. Interconnections 20 as well as bond pads 19 may be, for example, deposited metal circuitry, such as conductors formed from nickel and copper, and then plated with gold.

Substrate 11 is positioned on substrate 12 with opening 11b exposing semiconductor device 16, bond pads 19 and portions of interconnections 20. A plurality of solder pins 11a are positioned around the edges of substrate 11. A plurality of electrical interconnections 23 are in electrical contact with a respective solder pin 11a. Holes 22 are plated through-holes or vias which electrically connect conductor 20 on substrate 12 with conductor 23 on substrate 11.

Substrate 14 is the same as substrate 12, except that in FIG. 1, the backside of substrate 14 is shown. Substrate 14 has a plurality of solder pins 14a around the edges of substrate 14, and a central opening 14b. Substrate 14 also has bond pads (not illustrated in FIG. 1) that connected to interconnections the same as interconnections 20 on substrate 12. The bond pads and interconnections are on the "bottom" face of substrate 14 and are not shown in FIG. 1.

Substrate 15 has a plurality of solder pins 15a around its edges and is the same as substrate 11 having plated through-holes or vias 15c and interconnections (not illustrated in FIG. 1), and a central opening 15b.

Solder pins 13a extend up through corresponding openings (not illustrated in FIG. 1) and electrically contact with solder pins 12a substrate 12. Solder pins 12a on substrate 12 extend through corresponding openings in substrate 11 and electrically connected a respective solder pin 11a.

The solder pins 14a on substrate 14 extend out the "backside of substrate 14 and extend into corresponding openings in substrate 13 to electrically connect with pins 13a. The solder pins 15a on substrate 15 extend into corresponding openings in substrate 14 to electrically connected with a respective solder pin 14a. The interconnecting of the solder pins provides electrical connection through the solder pins 11a–15a from one end of module 10 to the other, for example, there is electrical contact between solder pins 15a and 11a through solder pins 14a, 13a and 12a.

Figure 2:
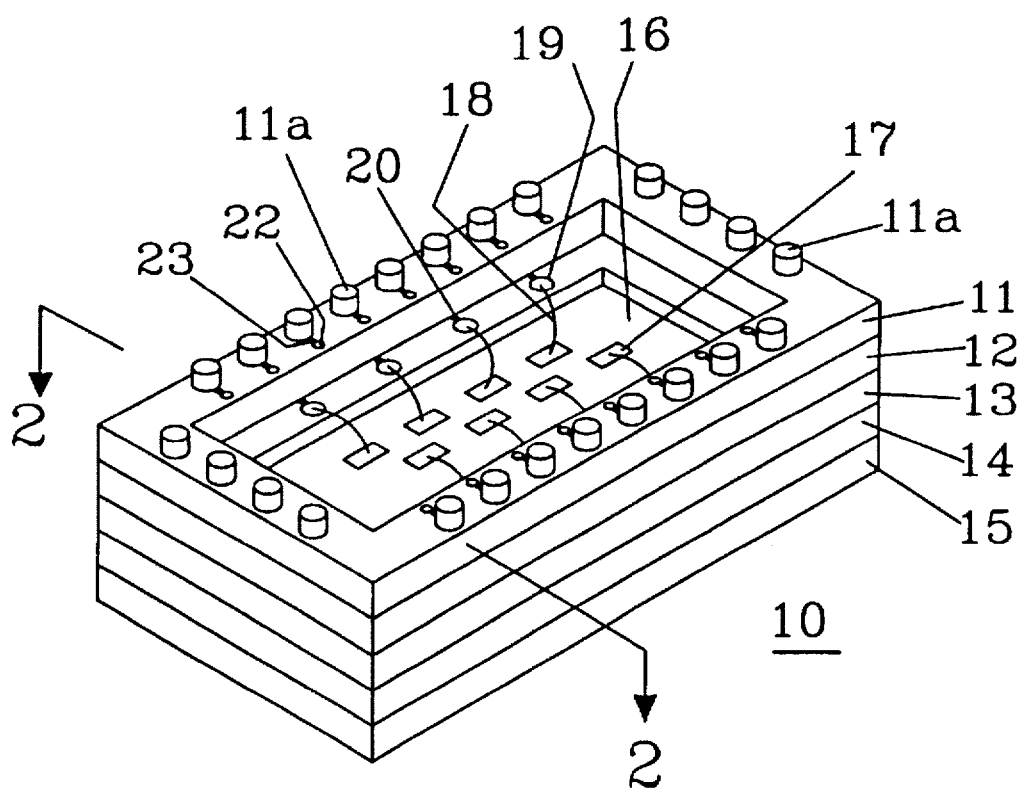
FIG. 2 is an isometric illustration showing one side of a module for holding two integrated circuit devices.

FIG. 2 is an isometric illustration showing one side of a module 10 with the layers 11–15 joined together to form module 10. Layers 11–15 are electrically interconnected by the solder pins in each layer. FIG. 2 shows the bond pads 17 of semiconductor device connected to contacts 16 by bond wires 18. Each contact 16 is connected to a conductor 20 that is on the surface of substrate 12, and extends under substrate 11 electrically contacting metallized via 22 which extends through substrate 11 to conductor 23 which is in electrical contact with solder pin 21.

Figure 3:
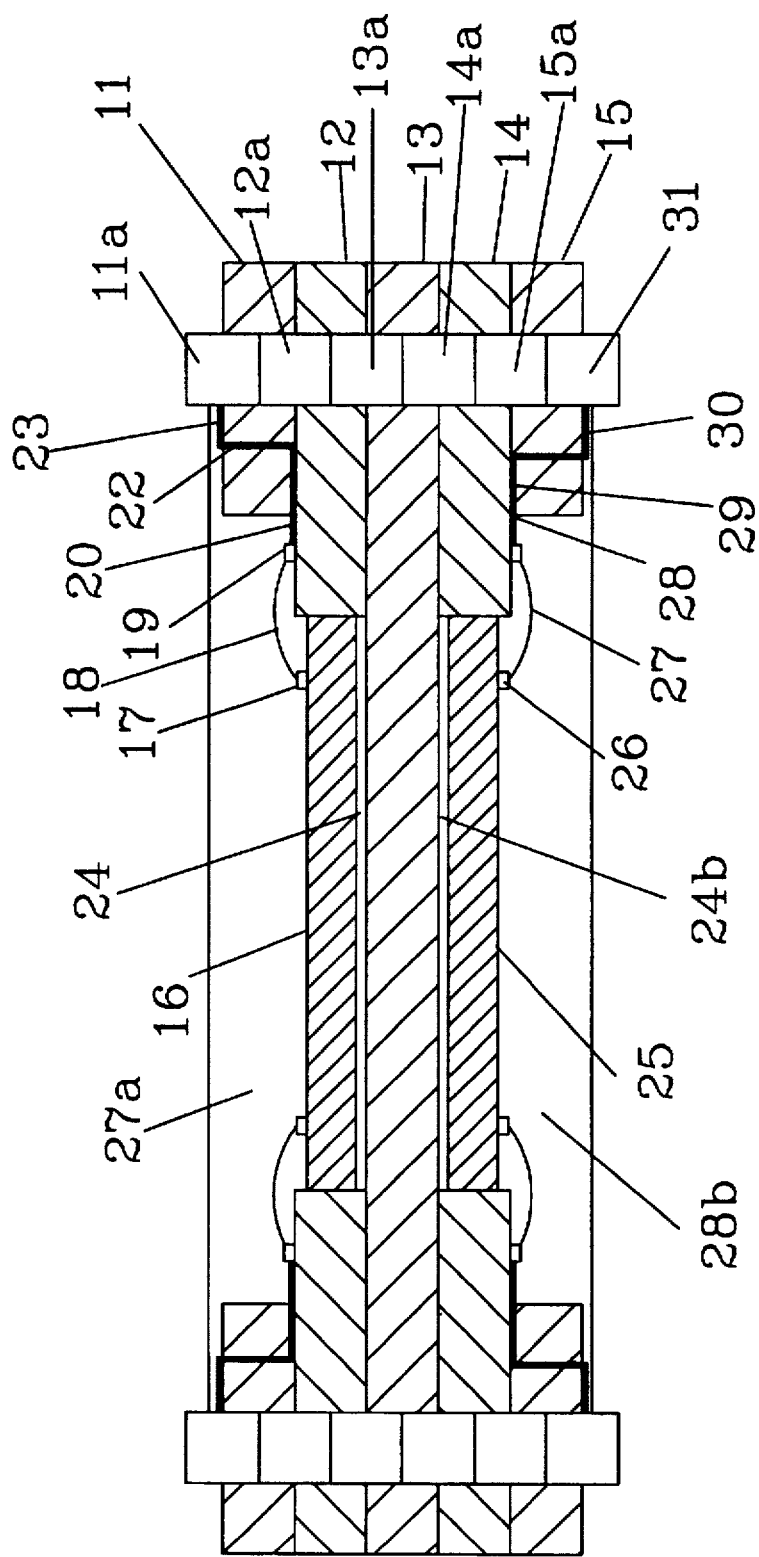
FIG. 3 shows a cross-sectional view of a module.

FIG. 3 is a cross-sectional view taken through section 2—2 of FIG. 2. In FIG. 3, bond pads 17 are shown connected to contact 19s on layer 12 by bond wires 18. Metallized via 22 is shown connecting conductor 20 on substrate 12 to conductor 23 on substrate 11. The column of solder pins 11a–15a are shown in electrical contact with each other. An additional solder pin 31 is show. Pin 31 makes contact with a bottom substrate described below.

Each side of module 10 is coated with an epoxy encapsulant 27a and 28a. Encapsulant 27a and 28b covering the semiconductor device (16 and 25) on its respective side, and all the contacts (17,26), bond wires (18,27) and conductors (20,23,28,30) on substrates 11 and 12.

Figure 4:
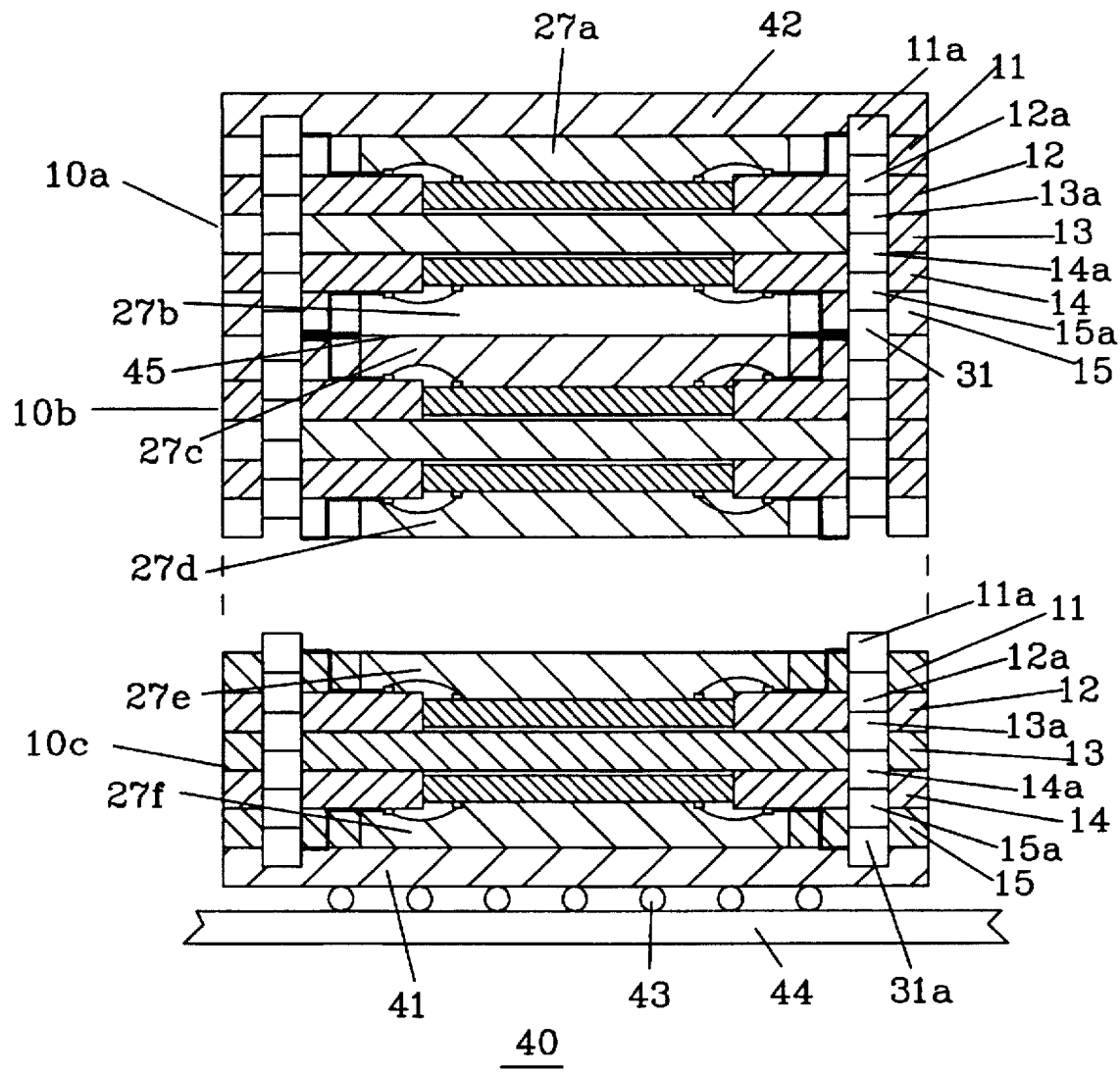
FIG. 4 shows a stacked array of modules.

FIG. 4 shows a module 40 made up of a plurality of modules. Modules 10a, 10b, and 10c are shown stacked together to form an array of modules. Only three modules 10a, 10b and 10c are shown, but any desire number may be stacked together to make a composite module. Modules 10a, 10b and 10c are connected by solder pins (11a–15a) the same as the solder pins that interconnect the substrate in a single module. In FIG. 4, module 10a is connected to module 10b by a connecting pin 31. Module 10c is connected to module 10b by pin 11a. Module 10c is connected to base substrate 41 by pin 31. In a similar manner, top substrate 42 is connected to module 10a by pin 11a of module 10a.

At the interface 45, between modules 10a and 10b, the in encapsulating materials 27b and 27c electrically insulate one module from the other. Similarly, the encapsulant 27d and 27e electrically isolate modules 10b and 10c from each other. Encapsulant 27f electrically insulates module 10c from any circuitry or other conducting elements on base substrate 41.

Base substrate 41 has a plurality of solder balls 43 connecting interconnecting conductors (described below) which interconnect the solder pins 31a with circuitry on printed wiring board 44.

Top substrate 42 is used to enclose the top of the top module 10c, and in some instances may have interconnecting conductors (not illustrated) thereon.

Figure 5:
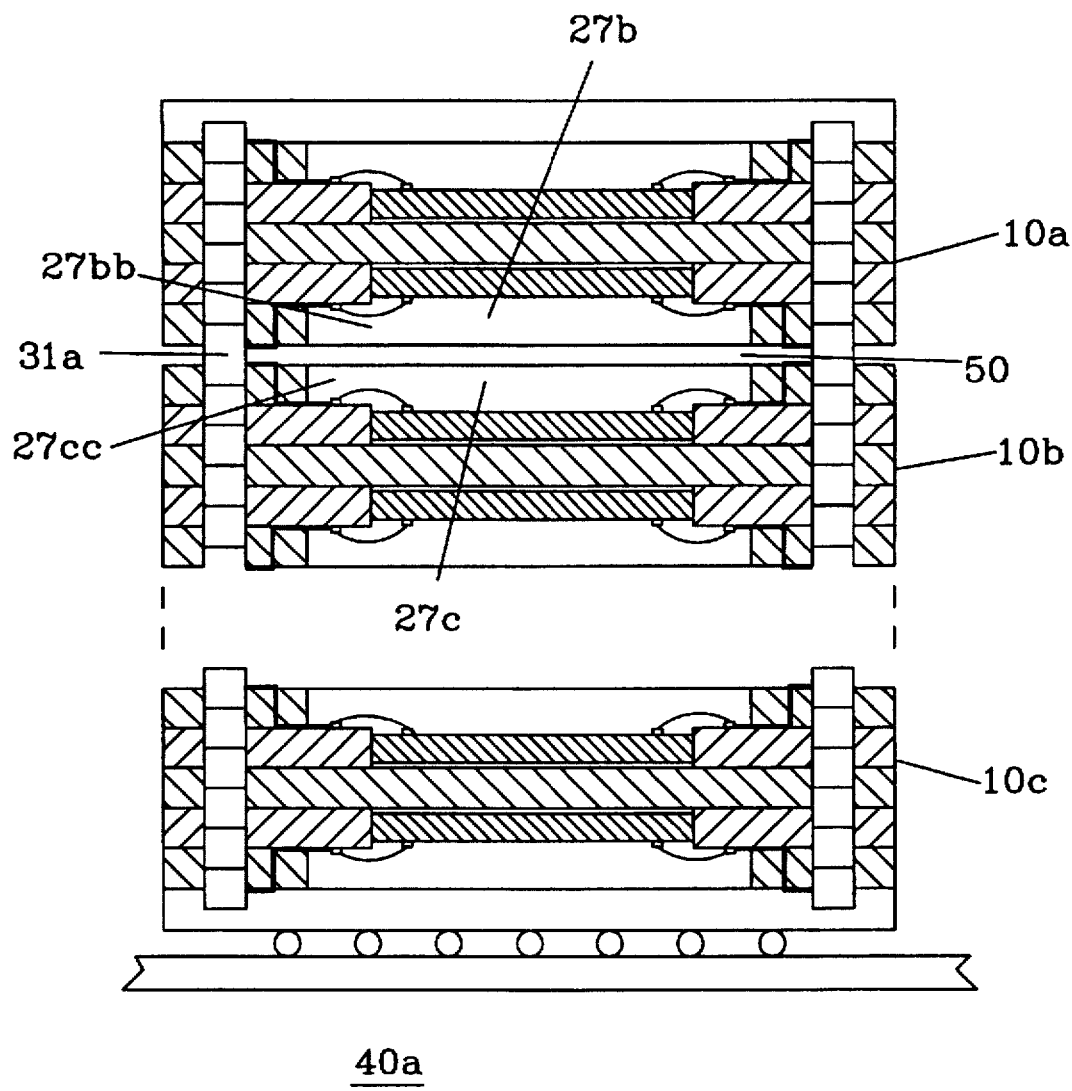
FIG. 5 is another embodiment of a stacked array of modules.

FIG. 5 shows a stacked array of modules 10a, 10b and 10c the same as the stacked array in FIG. 4, except that the adjacent modules are not in direct contact with each other. The face 27bb of encapsulant 27b and face 27cc of encapsulant 27a are not in contact with each other as in FIG. 4, but there is an air space 50 between the encapsulant faces 27bb and 27cc. This spacing is provided by solder pin 31a which is longer than pin 31 of FIG. 4. The longer pin 31a provides an air space between each of the modules in array 40a to provide for better heat dissipation when required.

FIGS. 1–5 show a module having five substrates, but each module could include only three substrates by encapsulating the tops of, for example, substrates 12 and 14.

Figure 6:
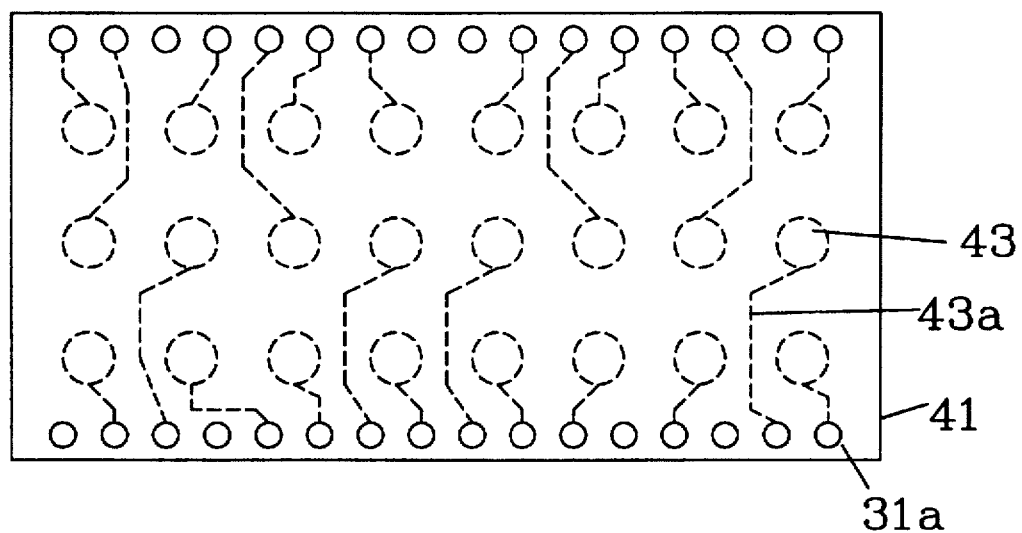
FIG. 6 is a top view of a module base plate.
Figure 7:
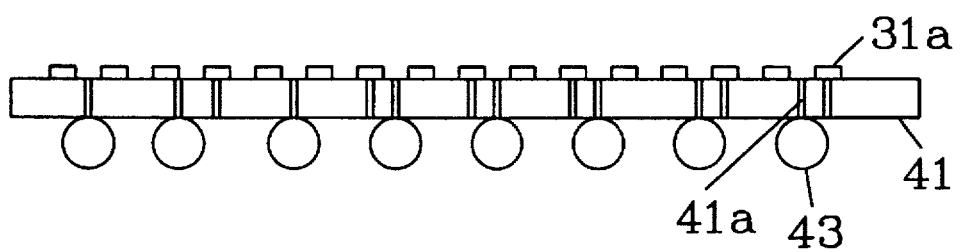
FIG. 7 is a side view of the module base plate.

FIGS. 6 and 7 are top and side views of base substrate 41. Base substrate 41 has a plurality of solder balls 43 which are interconnected with solder pins 31a by conductors 43a and metalized as 41a.

Figure 8:
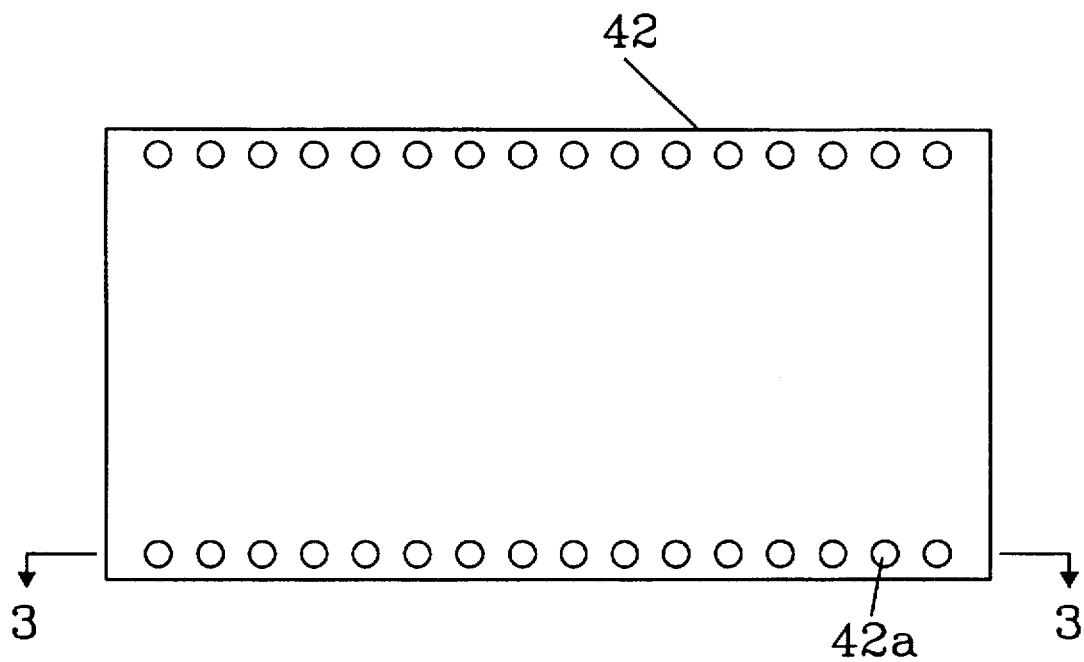
FIG. 8 is a top view of a module top plate.
Figure 9:
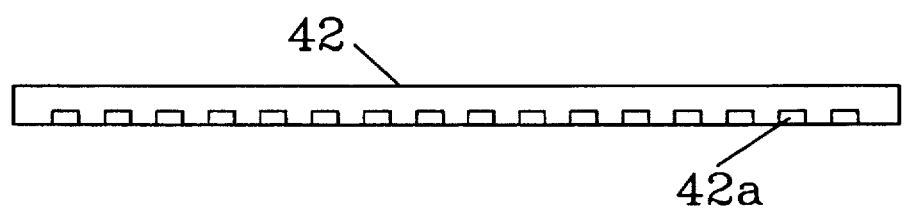
FIG. 9 is a side view of the module top plate.

FIG. 8 is a bottom side of top substrate 42 and FIG. 9 is cross-sectional view of top substrate 42 taken through section 3—3 of FIG. 8. Top substrate 42 has a plurality of holes 42a into which solder pins 11a (FIGS. 2–5) are inserted to hold top substrate on module 10a.

What is claimed:

1. A double sided semiconductor module, comprising:
   a first substrate having first and second sides, with one semiconductor device, having bond pads thereon, on each of said first and second sides;
   at least one additional substrate on each of said first and second sides having an opening in the substrate through which a semiconductor device is mounted on said first and second sides of the first substrate; and
   a plurality of solder pins associated with each of said first and additional substrates, connected to contact pads on the semiconductor devices, and extending from and to openings in said first and additional substrates.

2. The semiconductor module according to claim 1, including second additional substrates, one each on said additional substrates on each of said first and second sides of the first substrate.

3. The semiconductor module according to claim 1, wherein the openings in said additional substrates are filled with an epoxy to encapsulate the semiconductor device within the opening.

4. The semiconductor module according to claim 1, wherein said solder pins extend partially through and above the respective substrate.

5. The semiconductor module according to claim 1, including electrical conductors on through some of the substrates which are inter interconnected with the bond pads on the semiconductor devices.

6. The semiconductor module according to claim 1, including a top header and a bottom heater on said module, said bottom header including contacts thereon for interconnecting the module to a printed circuit boar.

* * * * *